(12) United States Patent
Nelson et al.

(10) Patent No.: US 10,903,034 B2
(45) Date of Patent: Jan. 26, 2021

(54) PLANAR FIELD EMISSION TRANSISTOR

(71) Applicant: WiSys Technology Foundation, Inc., Madison, WI (US)

(72) Inventors: Charles D Nelson, Saint Paul, MN (US); Harold T Evensen, Verona, WI (US)

(73) Assignee: WISYS TECHNOLOGY FOUNDATION, INC., Madison, WI (US)

( * ) Notice: Subject to any disclaimer, the term of this patent is extended or adjusted under 35 U.S.C. 154(b) by 0 days.

(21) Appl. No.: 16/342,475

(22) PCT Filed: Oct. 17, 2017

(86) PCT No.: PCT/US2017/056892
§ 371 (c)(1),
(2) Date: Apr. 16, 2019

(87) PCT Pub. No.: WO2018/075459
PCT Pub. Date: Apr. 26, 2018

(65) Prior Publication Data
US 2019/0252146 A1 Aug. 15, 2019

Related U.S. Application Data

(60) Provisional application No. 62/409,109, filed on Oct. 17, 2016.

(51) Int. Cl.
*H01J 21/10* (2006.01)
*H01J 9/02* (2006.01)
(Continued)

(52) U.S. Cl.
CPC ............ *H01J 21/105* (2013.01); *H01J 1/304* (2013.01); *H01J 9/025* (2013.01); *H01J 9/18* (2013.01);
(Continued)

(58) Field of Classification Search
CPC .......... H01J 21/105; H01J 19/82; H01J 1/304; H01J 9/025; H01J 9/18; H01J 19/38;
(Continued)

(56) References Cited

U.S. PATENT DOCUMENTS

| 2003/0122467 A1* | 7/2003 | Cho | H01J 9/025 313/309 |
| 2004/0183421 A1* | 9/2004 | Nakamoto | H01J 1/304 313/309 |

(Continued)

FOREIGN PATENT DOCUMENTS

WO   WO-2009151170 A1 * 12/2009 ............ H01J 21/20

OTHER PUBLICATIONS

Gerald J. Brady et al.; "Quasi-ballistic carbon nanotube array transistors with current density exceeding Si and GaSas"; Science Advances Sep. 2, 2016: vol. 2, No. 9, e1601240; DOI: 10.1126/sciadv.1601240; https://advances.sciencemag.org/content/2/9e1601240—(26) pages.
(Continued)

*Primary Examiner* — Yasser A Abdelaziez
(74) *Attorney, Agent, or Firm* — Boyle Fredrickson, S.C.

(57) ABSTRACT

A field emission transistor uses carbon nanotubes positioned to extend along a substrate plane rather than perpendicularly thereto. The carbon nanotubes may be pre-manufactured and applied to the substrate and then may be etched to create a gap between the carbon nanotubes and an anode through which electrons may flow by field emission. A planar gate may be positioned beneath the gap to provide a triode structure.

17 Claims, 4 Drawing Sheets

(51) Int. Cl.
  *H01J 19/24* (2006.01)
  *H01J 19/38* (2006.01)
  *H01L 51/00* (2006.01)
  *H01L 51/05* (2006.01)
  *H01J 1/304* (2006.01)
  *H01J 19/82* (2006.01)
  *H01J 9/18* (2006.01)
  *H01L 51/10* (2006.01)

(52) U.S. Cl.
  CPC .............. *H01J 19/24* (2013.01); *H01J 19/38* (2013.01); *H01J 19/82* (2013.01); *H01L 51/0017* (2013.01); *H01L 51/0045* (2013.01); *H01L 51/0048* (2013.01); *H01L 51/055* (2013.01); *H01L 51/0558* (2013.01); *H01L 51/105* (2013.01)

(58) Field of Classification Search
  CPC .... H01J 19/24; H01L 51/0045; H01L 51/105; H01L 51/055; H01L 51/0017; H01L 51/0558; H01L 51/0048
  See application file for complete search history.

(56) References Cited

U.S. PATENT DOCUMENTS

| | | | |
|---|---|---|---|
| 2005/0152155 A1* | 7/2005 | Kang | H01J 9/241 362/558 |
| 2006/0097615 A1* | 5/2006 | Tsakalakos | B82Y 10/00 313/309 |
| 2006/0124958 A1* | 6/2006 | Cox | B82Y 10/00 257/109 |
| 2008/0191189 A1* | 8/2008 | Kastalsky | H01L 29/0676 257/10 |
| 2012/0169209 A1* | 7/2012 | Liu | H01J 29/04 313/310 |
| 2017/0062743 A1* | 3/2017 | Cao | H01L 51/0048 |

OTHER PUBLICATIONS

Yuning Sun et al,; "Field emission behavior of carbon nanotube field emitters after high temperature thermal annealing"; AIP Advances: vol. 4, No. 7; Published Online: Jul. 9, 2014; https://aip.scitation.org/doi/10.10631/1.4889896—(18) pages.

* cited by examiner

PLANAR FIELD EMISSION TRANSISTOR

CROSS REFERENCE TO RELATED APPLICATION

This application claims the benefit of U.S. provisional application 62/409,109 filed Oct. 17, 2016, and hereby incorporated by reference in its entirety.

BACKGROUND OF THE INVENTION

The present invention relates to transistors and specifically to a field emission transistor having an improved planar construction.

Vacuum tubes, such as a triode, provide for electrical amplification by controlling the flow of electrons in a vacuum between a cathode and anode under the influence of electrical voltage applied between the cathode and anode. Control of the electron flow is provided by means of a grid interposed between the anode and cathode that creates an electrical field offsetting the bias between the anode and cathode. The grid is normally placed near the cathode to emphasize its effect.

Vacuum tubes have been largely replaced by "solid-state" transistors constructed of semiconducting materials for most electrical applications, in part, because of disadvantages of vacuum tubes with respect to size, reliability, power consumption, and cost. Nevertheless, vacuum tubes have a number of advantages over solid-state devices including very high operating frequencies, increased resistance to radiation damage, and lower noise and distortion.

Recently miniaturized vacuum tube type devices have been developed termed "vacuum field emission transistor" (VFET). Such transistors provide anodes and cathodes with sharpened points in close proximity so as to promote field emissions at lower voltages and without heating of the cathode required in conventional vacuum tubes. Heater failure is a primary source of vacuum tube failure and the reason for relatively high energy consumption. The lower voltages and close proximity of the anode and cathode also allow the transistors to operate at atmospheric pressures: low voltages ensure that the emitted electrons lack the energy to ionize surrounding air molecules, and structure sizes smaller than the mean free path of electrons in atmospheric pressure gas reduces the probability of electron-molecule collisions.

A significant obstacle to the development of the VFET is the production of small-scale sharpened anodes and cathodes that can operate for long time periods without significant degradation from ion bombardment and thermal and mechanical stresses. Advances have been made with respect to creating sufficiently sharpened cold cathodes through the use of carbon nanotubes, for example, as discussed in US patent application 20110031867 incorporated by reference. Such systems require a carefully controlled synthesis step in which a carbon nanotube is grown in the proper location and orientation for the VFET, a requirement which represents a significant obstacle to large-scale commercial manufacturing.

SUMMARY OF THE INVENTION

The present invention provides a VFET structure based on carbon nanotubes applied in a planar fashion to lie along an upper surface of an insulated substrate. The carbon nanotubes can be prefabricated using any number of efficient fabrication processes and may be applied in oriented fashion to extend between a first and second electrode applied to the substrate. Precise gaps between the anode and cathode electrodes can be created by selectively etching gaps in the carbon nanotubes using conventional integrated circuit techniques.

Specifically, in one embodiment, the present invention provides a field emission transistor having a planar substrate with a first and second electrode supported by the substrate in spaced opposition across a separation region extending along a plane of the substrate. A plurality of carbon nanotubes are arranged in electrical communication with the first electrode to extend from the first electrode toward the second electrode terminating before the second electrode at a free space region in the separation region. A gate electrode is placed in the free space region to establish an electrical field in the free space region. Electrons may be transmitted between the first and second electrodes by a combination of electrical conduction through the plurality of carbon nanotubes and field emissions in the free space region, the latter controllable by the gate electrode.

It is thus a feature of at least one embodiment of the invention to provide improved manufacturing technique for use of carbon nanotubes that allows prefabrication of the carbon nanotubes and/or simpler placement of the carbon nanotubes.

The plurality of carbon nanotubes may be oriented to preferentially extend along the direction perpendicular to an extent of the first and second electrodes along the planar substrate.

It is thus a feature of at least one embodiment of the invention to improve uniformity in the transistor characteristics by controlling carbon nanotube orientation.

The free space region for each of the plurality of carbon nanotubes may be substantially identical.

It is thus a feature of at least one embodiment of the invention to provide a method that can enforce a relatively constant free space region for predictable transistor characteristics.

The first electrode may be a metal layer applied to the substrate over pre-applied carbon nanotubes.

It is thus a feature of at least one embodiment of the invention to provide a simple method of connecting the carbon nanotubes to external devices through the use of a metallization layer applied to the carbon nanotubes.

The field emission transistor may further include an insulating material supported by the substrate within the separation region to provide an insulating surface extending along the plane of the substrate to which the plurality of carbon nanotubes are applied.

It is thus a feature of at least one embodiment of the invention to permit application of the carbon nanotubes directly to an insulator simplifying fabrication and providing good planar alignment and support.

The gate may be a conductive layer extending along a plane of the substrate.

It is thus a feature of at least one embodiment of the invention to provide a simple gate structure that can be readily fabricated using integrated circuit techniques as a layer of the integrated circuit.

The gate may be separated from the free space region by the insulating surface.

It is thus a feature of at least one embodiment of the invention to prevent direct contact between the gate and either of the anode or cathode of the emission transistor through the use of an intervening insulating layer.

The field emission transistor may operate with a power supply applying a negative voltage to the first electrode for emission of electrons from ends of the plurality of carbon nanotubes. This negative voltage may be with respect either one or both of the second electrode and the gate electrode, representing slightly different modes of operation discussed below.

It is thus a feature of at least one embodiment of the invention to promote electron emission from the robust tip of the carbon nanotube resistant to erosion.

The free space region may provide a path of field emissions extending less than 100 nanometers.

It is thus a feature of at least one embodiment of the invention to provide a low voltage device that can operate in vacuums or at low pressures.

The field emissions may be between ends of the carbon nanotubes and the second electrode, and the second electrode is a metal electrode.

It is thus a feature of at least one embodiment of the invention to provide a broad area anode simplifying alignment and construction of the device.

In one embodiment, the carbon nanotubes may extend along the substrate in cantilevered fashion prior to reaching the free space region.

It is thus a feature of at least one embodiment of the invention to provide improved field emissions that may result from removal of the ends of the carbon nanotubes from the insulating surface.

The field emission transistor, in some embodiments, may include a second plurality of carbon nanotubes in electrical communication with the second electrode and extending from the second electrode toward the first electrode to terminate at a free space region in the separation region supported by and extending along the insulating surface toward the first electrode without contacting the first electrode, and electrons may be transmitted between the first and second electrodes by means of electrical conduction from the first electrode through the first plurality of carbon nanotubes and field emissions from the first plurality of carbon nanotubes to the second plurality of carbon nanotubes and by electrical conduction from the second plurality of carbon nanotubes to the second electrode.

It is thus a feature of at least one embodiment of the invention to provide carbon nanotube emitters on both electrodes, for example, for improved field emissions shaping.

The field emission transistor may include multiple independent first electrodes and multiple independent second electrodes distributed over the planar substrate to provide multiple independently controllable circuit paths.

It is thus a feature of at least one embodiment of the invention to permit the simple fabrication of multiple devices on a planar substrate by reproduction of the structure at different locations on the substrate.

The invention permits an improved manufacturing process in which a plurality of carbon nanotubes may be applied to an insulating surface of a substrate and a gap may be etched in the carbon nanotubes to define a free space region. A first electrode may be applied to the substrate in electrical communication with the carbon nanotubes on one side of the free space region and a second electrode applied to the substrate separated from the carbon nanotubes in communication with the first electrode by the free space region. A gate electrode may be supported by the substrate positioned to establish a controlling electrical field within the free space region It is thus a feature of at least one embodiment of the invention to eliminate the need to precisely control the length of the carbon nanotubes or their position by etching a gap after application of the carbon nanotubes to the substrate.

The carbon nanotubes may be prefabricated and then applied in a thin layer to the insulating surface to be oriented to extend in a substantially parallel fashion between the first and second electrodes.

It is thus a feature of at least one embodiment of the invention to permit prefabrication of the carbon nanotubes using techniques not readily adaptable to growing carbon nanotubes in place on the substrate.

The etching of the gap may provide a free space region for each of the plurality of carbon nanotubes that is substantially identical.

It is thus a feature of at least one embodiment of the invention to eliminate the need to precisely position the ends of the carbon nanotubes or to carefully control their growth in place.

The first electrode may be a metal layer applied to the substrate over pre-applied carbon nanotubes.

It is thus a feature of at least one embodiment of the invention to provide a simple method of communicating between carbon nanotubes and external equipment through the metallic electrode.

These particular objects and advantages may apply to only some embodiments falling within the claims and thus do not define the scope of the invention.

DETAILED DESCRIPTION OF THE PREFERRED EMBODIMENT

Figure 1:
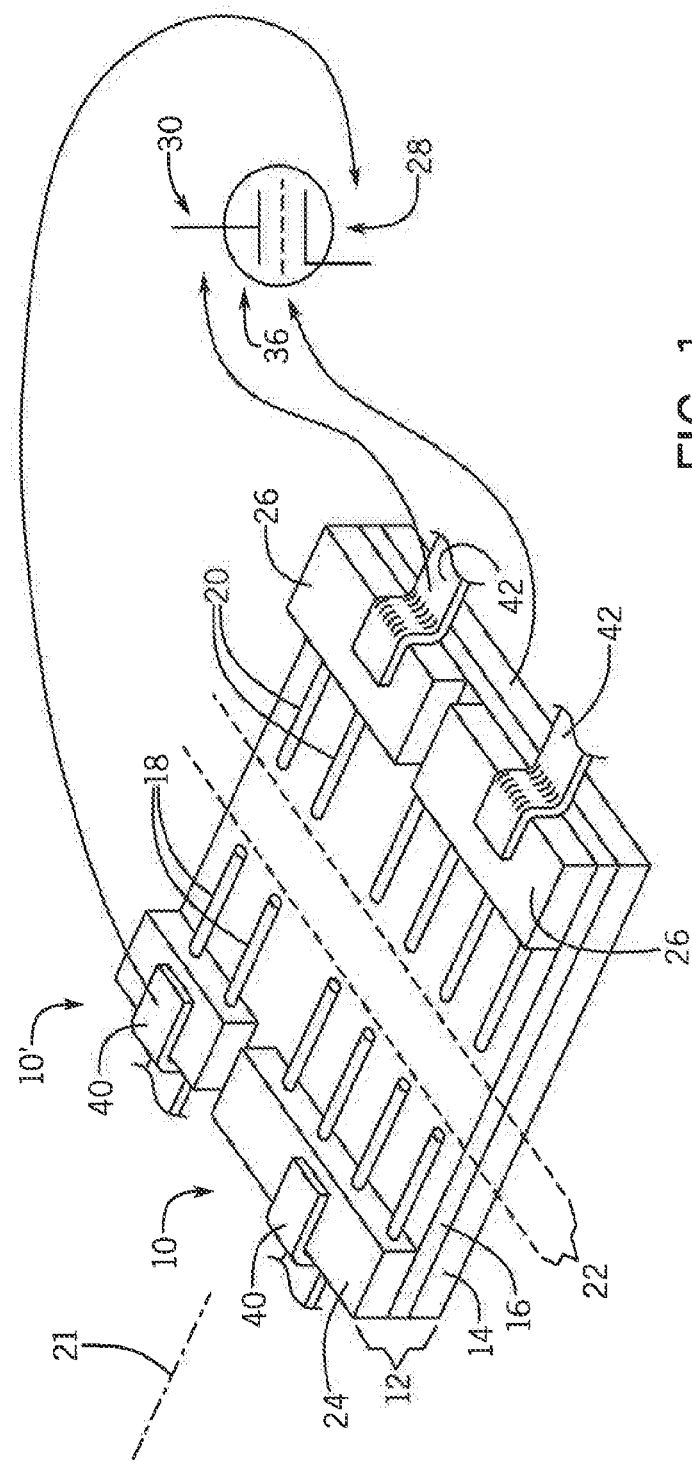
FIG. 1 is a fragmentary perspective view of the architecture of one embodiment of the present invention showing opposed ranks of parallel nanotube cathodes and anodes as configured to create a triode.

Referring now to FIG. 1, a field emission transistor 10 constructed according to the present invention may be fabricated on a planar substrate 12, for example, comprised of a layer of silicon 14 covered by a thin layer of insulating silicon dioxide 16. Such substrates are readily available as used in the integrated circuit industry.

Attached to the upper surface of the substrate 12 are parallel ranks of cathode carbon nanotubes 18 and anode carbon nanotubes 20 extending parallel to a longitudinal axis 21 generally parallel to the plane of the upper surface of the substrate 12. In this way, the carbon nanotubes 18 and 20 are supported against the upper surface of the substrate 12 along their entire length. While parallel carbon nanotubes 18 are preferred, the invention also contemplates that randomly arrayed carbon nanotubes may be used, or carbon nanotubes that are preferentially oriented along a single axis but not necessarily parallel.

Each cathode carbon nanotube 18 is parallel to and coaxial with a corresponding anode carbon nanotube 20 and pairs of aligned cathode carbon nanotubes 18, and corresponding anode carbon nanotubes 20 are separated transversely (perpendicular to the longitudinal axis 21) so as to promote field emissions separately from each cathode carbon nanotube 18. Too close of a spacing reduces the field enhancement of the sharp ends of the carbon nanotubes.

The pairs of aligned cathode carbon nanotubes 18 and anode carbon nanotubes 20 are separated at their distal ends by a longitudinal gap 22 sized to be less than the mean free path of electrons in the environment of the gap 22 which may either be a vacuum or gas at low or atmospheric pressure. In one embodiment, the gas may be a noble gas such as helium. The longitudinal gap 22 may be approximately 40 nanometers, for example, and typically less than 100 nanometers. An etching process removing portions of the carbon nanotubes after they have been deposited on the substrate 12 may provide an extremely uniform longitudinal gap 22.

Sets of the cathode carbon nanotubes 18 may be electrically joined by a transversely extending metallic bus conductor 24 at the proximal ends, for example, applied by conventional integrated circuit techniques such as sputtering, thermal evaporation, or the like. The metallic bus conductor 24, for example, may be lead, gold or other conductive material and will typically span multiple cathode carbon nanotubes 18 to provide desired current flow and provides a more uniform operation by averaging out inconsistencies from the carbon nanotube. A similar metallic bus conductor 26 will join the proximal ends of the anode carbon nanotubes 20 opposed to the cathode carbon nanotubes 18 joined by the metallic bus conductor 24. The metallic bus conductor 24 provides a transistor cathode 28 of a field emission transistor according to the present design with the metallic bus conductor 26 providing the transistor anode 30 of the field emission transistor 10. As depicted, multiple transistors 10, 10' may be laid out along a common transverse axis through the use of multiple electrically independent metallic bus conductors 24 and 26 and the structure reproduced along parallel transverse axes to create multiple devices over the surface of the substrate.

Figure 2:
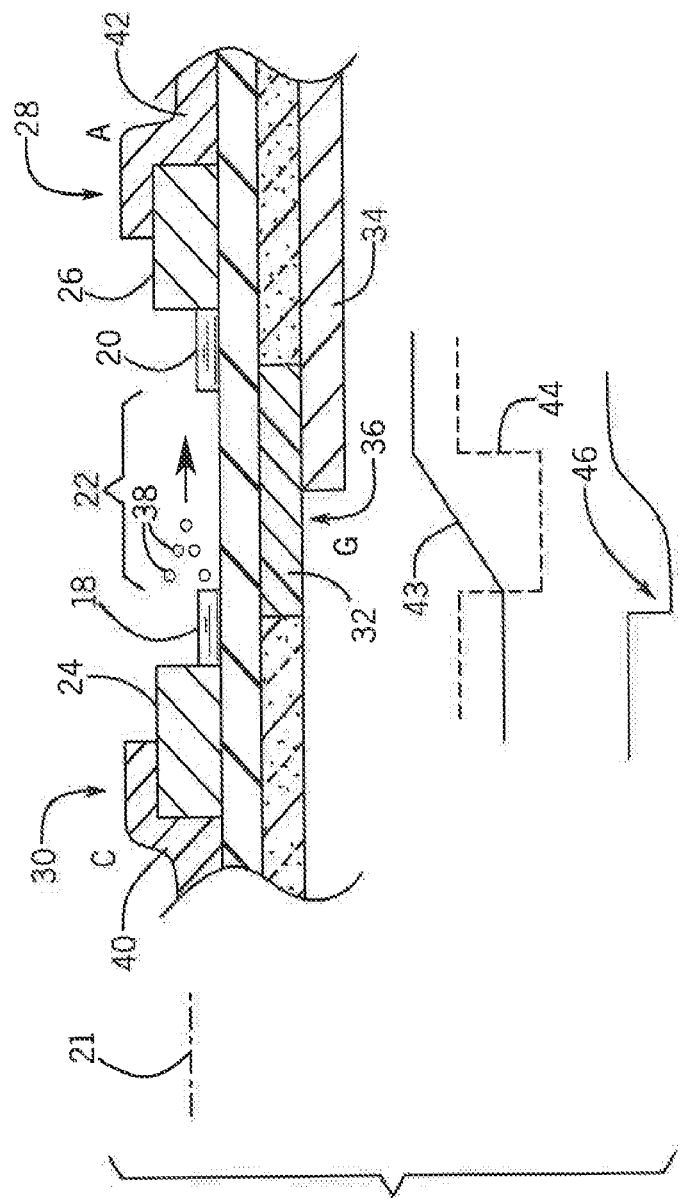
FIG. 2 is a side elevational cross-section of the device of FIG. 1 showing the path of electrons across a vacuum or low-pressure gap controlled by superposition of a bias field and gate field.

Referring now to FIG. 2, the silicon 14 underneath the gap 22 and underneath the insulating silicon dioxide 16 between the cathode carbon nanotubes 18 and the anode carbon nanotubes 20 may be doped into a conductive gate region 32, for example, communicating with a gate lead 34 providing a gate voltage input. The invention also contemplates the possibility of placing a gate over the top of the carbon nanotubes 20, for example, by an adding additional layer of insulating material and attaching electrodes to the top.

This conductive gate region 32 provides the gate 36 of the field emission transistor 10 and will control the flow of electrons 38 between the cathode carbon nanotubes 18 and the anode carbon nanotubes 20. The present inventors envision one of two possible modes of operation. In one mode, a negative voltage is applied to the cathode via a cathode lead 40 with respect to a voltage applied to the anode lead 42 to produce a positive-going voltage gradient 43 in the gap 22 promoting field emissions. This positive voltage gradient 43 alone will draw electrons 38 from the cathode carbon nanotubes 18 to the anode carbon nanotubes 20 to provide electrical current. Alternatively, the field emissions may be created by a negative voltage on the anode lead 42 with respect to the gate region 32.

In either case, a control voltage applied to the gate lead 34 will be used to modulate the current flowing between electrodes formed by the metallic bus conductors 24 and 26.

While the inventors do not wish to be bound by a particular theory, preliminary measurements suggest that the gate voltage can control current flow between the cathode and anode through two mechanisms: (1) by affecting field emissions in the manner of a vacuum tube and (2) by affecting the conductivity of the nanotubes themselves through the field effect (changing the number of charge carriers in the carbon nanotube). The balance between these two operating roles of affecting field emission of electrons and affecting nanotube conductivity can be adjusted by selecting between "metallic" carbon nanotubes and semiconducting carbon nanotubes, the former of which would have a conductivity independent of the gate voltage. Both of these types of carbon nanotubes are pure carbon but have a difference in diameter and chirality of the tube as is generally understood in the art.

Referring now to FIG. 3, the fabrication of the field emission transistor 10 of FIG. 1 may be performed through the modification of fabrication techniques used to produce carbon nanotube field effect transistors, for example, as described in Gerald J. Brady, Austin J. Way, Nathaniel S. Safron, Harold T. Evensen, Padma Gopalan and Michael S. Arnold, "Quasi-ballistic carbon nanotube array transistors with current density exceeding Si and GaAs" Science Advances volume 02 number 9, 2 Sep. 2016.

Figure 3A:
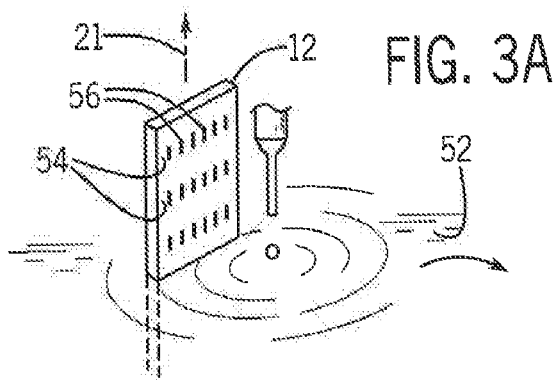
FIGS. 3a-g are depictions of process steps for fabricating the device of FIG. 1.

In that technique, carbon nanotubes 56, for example, commercially available from Sigma Aldrich under the trade designator 750514, may be generated and encapsulated with PFO-BPy commercially available from American Die Source under the tradename of ADS153UV and dispersed in chloroform to develop an ink 50. As shown in FIG. 3a, the ink may be periodically delivered in small doses (0.6-1.2 microliters) on the surface of a water subphase 52 into which substrate 12 has been immersed and is withdrawn slowly during the deposition process. The result is to produce a set of bands 54 of carbon nanotubes aligned perpendicular to the longitudinal axis of withdrawal organized by the process of dispersion of the ink on the water as adhering to the upper surface of the withdrawn substrate 12. Generally, the bands will be approximately 100 micrometers tall (along the longitudinal axis 21) and will span the entire width of the substrate 12.

Figure 3B:
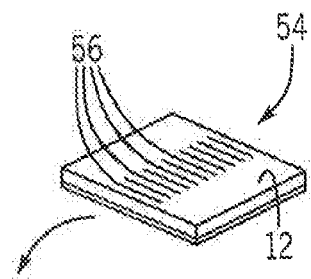
Figure 3C:
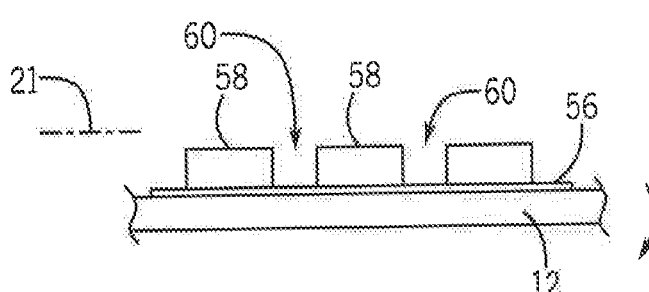
Figure 3D:
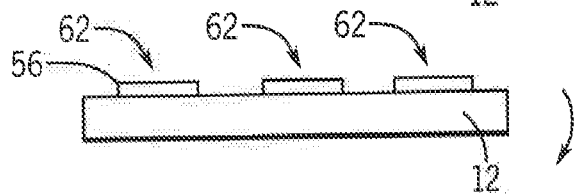
Figure 3E:
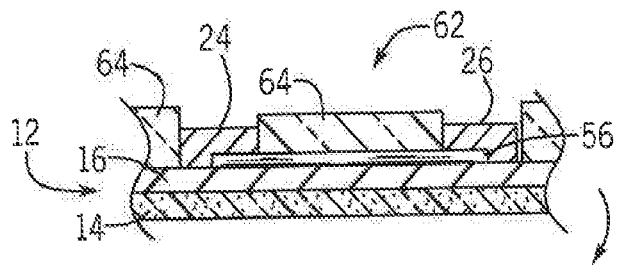

The chloroform of the ink is then evaporated producing a substrate 12 having multiple carbon nanotubes 56 in parallel spaced apart and orientated along each of the bands 54 as shown in FIG. 3b. The invention contemplates other methods of arranging the carbon nanotubes along the substrate including those which provide nonparallel orientations, for example, by spin casting of a slurry of dilute carbon nanotubes.

Carbon nanotubes 56 are then separated along the longitudinal axis 21 by a patterning using a protective layer 58 of polymethylmethacrylate (PMMA) applied over the surface of the carbon nanotubes 56 (shown in FIG. 3c) and removed selectively along transverse bands 60, for example, by electron beam lithography. The exposed regions of the carbon nanotubes 56 may then be etched with a reactive ion etching to remove segments of the carbon nanotubes 56 separating them into separate ranks 62 of parallel carbon nanotubes that are apart transversely (shown in FIG. 3d).

Alternatively, this step of etching may be postponed to the final steps of the process after the addition of stabilizing electrodes described below.

Each rank 62 may then be patterned again, (shown in FIG. 3e) after removal of the protective layer 58 by acetone, with a second protective layer 64 exposing only the ends of the carbon nanotubes 56 of each rank 62. The ends may be coated to provide for the metallic bus conductors 24 and 26, for example, by thermal deposition of lead in a 30-nanometer layer.

Figure 3F:
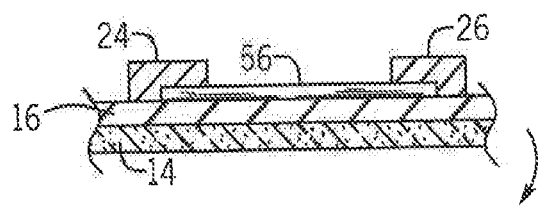
Figure 3G:
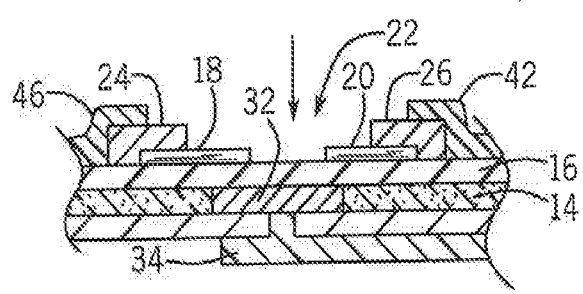

As shown in FIG. 3f, protective layer 64 may then be removed and, as shown in FIG. 3g, the gap 22 formed, for example, by electron beam lithography and reactive ion etching. This gap 22 may be nominally 40 nanometers measured along the longitudinal axis 21 and separates the carbon nanotubes 56 into the cathode carbon nanotubes 18 and anode carbon nanotubes 20 described above with respect to FIG. 1. Currently the inventors believe that smaller gaps may be possible and beneficial.

Referring still to FIG. 3g, standard integrated circuit techniques may then be used to provide cathode lead 40, anode lead 42, and gate lead 34.

Figure 4:
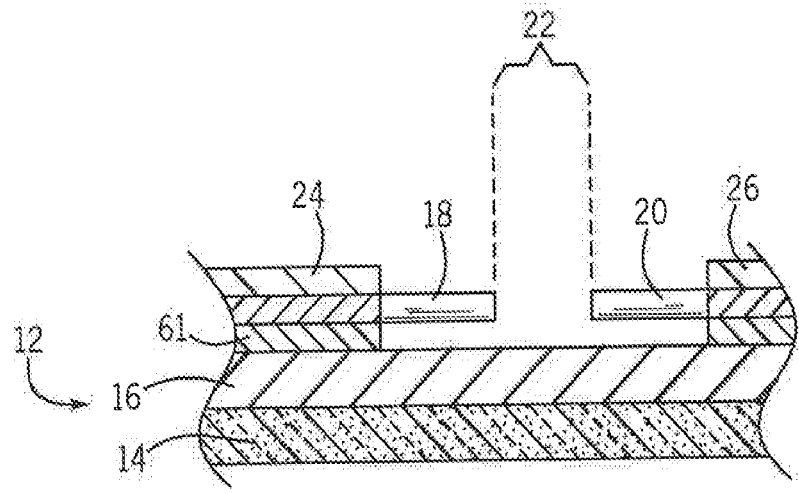
FIG. 4 is a figure similar to FIG. 2 showing an alternative embodiment employing a sacrificial layer to provide cantilevered ends of the cathode and anode carbon nanotubes.

Referring now to FIG. 4, it may be possible to free the cathode carbon nanotubes 18 and anode carbon nanotubes 20 from the surface of the substrate 12 through the use of a sacrificial layer of material 61 placed on top of the silicon dioxide layer 16 prior to the application of the carbon nanotubes with this material 61 removed after application of the metallic bus conductors 24 and 26. Removal of this material allows the ends of the cathode carbon nanotubes 18 to extend in cantilevered fashion up to the gap 22. Alternatively, channels may be pre-etched in the substrate 12 and the carbon nanotubes aligned to bridge the channels with the gap 22 cut over the channel.

It is believed that either metallic or semiconducting carbon nanotubes may be used in this process, thereby eliminating problems of contamination associated with use of carbon nanotubes and field effect transistors.

Figure 5:
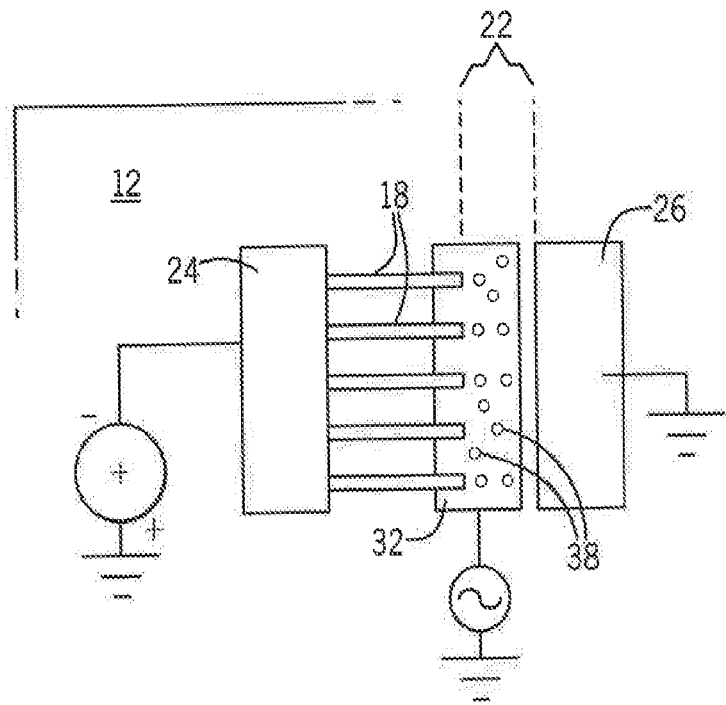
FIG. 5 is a top plan view of an alternative embodiment of the triode of FIG. 1 using the second electrode as a continuous anode.

Referring now to FIG. 5, in one embodiment the gap 22 may be positioned between the metallic bus conductor 24 and metallic bus conductor 26 to abut metallic bus conductor 26 which may serve as a broad area anode receiving electrons emitted from the carbon nanotubes 18. In this case the carbon nanotubes 20 normally extending from the second metallic bus conductor 26 are essentially removed by the etching process. The conductive gate region 32 is shifted toward the metallic bus conductor 26 to be positioned within the gap region controlling electron flow.

While the invention discusses parallel and aligned carbon nanotubes, the inventors also contemplate that unaligned carbon nanotubes may be used, for example, by depositing a random planar layer of overlapping carbon nanotubes and then patterning them as discussed above to provide for gap 22. In this case the carbon nanotubes would not be parallel and aligned but could still operate effectively with simplified manufacturing. The density of the random planar layer would be controlled to promote the desired spacing between ends of the carbon nanotubes at the gap 22 to enhance field emissions.

Although a planar gate construction positioned beneath the carbon nanotubes is described above, it will be appreciated that other gate geometries are possible including a gate positioned above the carbon nanotubes, or below and above the carbon nanotubes as well as a gate being positioned between individual or sets of carbon nanotubes or surrounding a path of electrons from cathode to anode for individual or sets of carbon nanotubes.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A field emission transistor comprising:
a planar substrate;
a first and second electrode supported by the substrate in spaced opposition across a separation region extending along a plane of the substrate;
a plurality of carbon nanotubes in electrical communication with the first electrode and extending from the first electrode toward the second electrode to terminate at a free space region in the separation region; and
a gate electrode for establishing an electrical field in the free space region;
wherein electrons may be transmitted between the first and second electrodes by a combination of electrical conduction through the plurality of carbon nanotubes and field emissions in the free space region, the latter controllable by the gate electrode;
wherein the first electrode is a metal layer applied to the substrate over pre-applied carbon nanotubes.

2. The field emission transistor of claim 1 wherein the plurality of carbon nanotubes are oriented to preferentially extend along a direction perpendicular to an extent of the first and second electrodes along the planar substrate.

3. The field emission transistor of claim 1 wherein the free space region for each of the plurality of carbon nanotubes is substantially identical.

4. The field emission transistor of claim 1 further including an insulating material supported by the substrate within the separation region to provide an insulating surface extending along the plane of the substrate to which the plurality of carbon nanotubes are applied.

5. The field emission transistor of claim 1 wherein the gate is a conductive layer extending along a plane of the substrate.

6. The field emission transistor of claim/wherein the gate is separated from the free space region by an insulating material.

7. The field emission transistor of claim 1 further including a power supply applying a negative voltage to the first electrode with respect to the second electrode for emission of electrons from ends of the plurality of carbon nanotubes.

8. The field emission transistor of claim 1 wherein the free space region provides a path of field emissions extending less than 100 nanometers.

9. The field emission transistor of claim 1 wherein the field emissions are between ends of the carbon nanotubes and the second electrode and wherein the second electrode is a metal electrode.

10. The field emission transistor of claim 1 wherein the carbon nanotubes extend along the substrate in cantilevered fashion prior to reaching the free space region.

11. The field emission transistor of claim 1 further wherein a second plurality of carbon nanotubes in electrical communication with the second electrode and extending from the second electrode toward the first electrode terminate at the free space region in the separation region; and
    wherein electrons may be transmitted between the first and second electrodes by means of electrical conduction from the first electrode through the first plurality of carbon nanotubes and by field emissions from the first plurality of carbon nanotubes to the second plurality of carbon nanotubes and by electrical conduction from the second plurality of carbon nanotubes to the second electrode;
    whereby the field emissions arc between ends of the first plurality of carbon nanotubes and second plurality of carbon nanotubes.

12. A method of fabricating a field emission transistor comprising:
    applying a plurality of carbon nanotubes to an insulating surface of a substrate;
    etching a gap in the carbon nanotubes to define a free space region;
    applying a first electrode to the substrate in electrical communication with the carbon nanotubes on one side of the free space region;
    applying a second electrode to the substrate separated from the carbon nanotubes in communication with the first electrode by the free space region;
    applying a gate electrode to the substrate positioned to establish a controlling electrical field within the free space region; and
    transmitting electrons between the first and second electrodes by a combination of electrical conduction through the plurality of carbon nanotubes and field emissions in the free space region, the latter controllable by the gate electrode.

13. The method of claim 12 wherein the plurality of carbon nanotubes are prefabricated and then applied in a thin layer to the insulating surface to be oriented to extend in a substantially parallel fashion between the first and second electrodes.

14. The method of claim 12 wherein the etching of the gap provides a free space region for each of the plurality of carbon nanotubes that is substantially identical.

15. The method of claim 12 wherein the first electrode is a metal layer applied to the substrate over pre-applied carbon nanotubes.

16. The method of claim 12 further including the step of applying a negative voltage to the first electrode with respect to the second electrode for emission of electrons from ends of the plurality of carbon nanotubes and controlling current flow between the first and second electrodes by modulating a gate voltage on the gate.

17. The method of claim 12 wherein the voltage between the first and second electrodes is less than 50 volts.

* * * * *